United States Patent
Huang et al.

[11] Patent Number: 6,037,206
[45] Date of Patent: Mar. 14, 2000

[54] METHOD OF FABRICATING A CAPACITOR OF A DYNAMIC RANDOM ACCESS MEMORY

[75] Inventors: Kuo-Tai Huang, Hsinchu; Hsi-Ta Chuang, Taipei; Tri-Rung Yew, Hsinchu Hsien, all of Taiwan

[73] Assignee: United Microelectronics Corp., Hsinchu, Taiwan

[21] Appl. No.: 09/080,116

[22] Filed: May 15, 1998

[30] Foreign Application Priority Data

Apr. 20, 1998 [TW] Taiwan ................................. 87105992

[51] Int. Cl.$^7$ .............................................. H01L 21/8242
[52] U.S. Cl. ........................................... 438/240; 438/253
[58] Field of Search .................................... 438/240, 253, 438/396, 650, 652, 654, 656, 686

[56] References Cited

U.S. PATENT DOCUMENTS

| 5,712,202 | 1/1998 | Liaw et al. ............................. | 438/253 |
|---|---|---|---|
| 5,776,815 | 7/1998 | Pan et al. ............................... | 438/253 |
| 5,843,818 | 12/1998 | Joo et al. ............................... | 438/240 |
| 5,972,769 | 10/1999 | Tsu et al. ............................... | 438/253 |

*Primary Examiner*—Chandra Chaudhari
*Attorney, Agent, or Firm*—Thomas, Kayden, Horstemeyer & Risley

[57] ABSTRACT

A method for fabricating a capacitor of a DRAM includes a lower conductive layer of the capacitor is formed over a substrate and is electrically coupled to an interchangeable source/drain region through a contact window penetrating an insulating layer. Then performing etching process on the lower conductive layer so as to form a fence-like plate with a higher height than a thickness of the lower conductive layer and adhere to the lower conductive layer. Next a media conductive layer is formed over the lower conductive layer and the fence-like plate. Then the technology of etching back is utilized to round the sharp area on the tip of the fence-like plate. The lower conductive layer and the media conductive layer are electrically coupled together as a lower electrode. Then, a dielectric thin film is formed over the media conductive layer and an upper electrode is formed over the dielectric thin film. Therefore, a MIM capacitor according to the preferred embodiment of the invention is formed.

24 Claims, 4 Drawing Sheets

METHOD OF FABRICATING A CAPACITOR OF A DYNAMIC RANDOM ACCESS MEMORY

CROSS-REFERENCE TO RELATED APPLICATION

This application claims the priority benefit of Taiwan application Ser. No. 87105992, filed Apr. 20, 1998, the full disclosure of which is incorporated herein by reference.

BACKGROUND OF THE INVENTION

1. Field of the Invention

This invention relates to a fabricating procedure of a semiconductor device, and more particularly to a fabricating procedure of a capacitor in a Dynamic Random Access Memory (DRAM).

2. Description of Related Art

For memory devices with high integration such as DRAM devices with memory capacity of 256 Megabit, their capacitor need a dielectric thin film to be constructed as the three dimensional structures like stacked type or trench type. Thus these memory devices should have a large area of the dielectric thin film to store the charge to avoid the soft error. Utilizing low pressure chemical vapor deposition (LPCVD), which is one of the chemical vapor deposition (CVD), to make the dielectric thin film of a material of $Ta_2O_5$ is popular for the present because this material produces a dielectric constant about 25, which is far larger than that of a material of oxide, and has a better ability of step coverage. The step coverage means that the covering surface is kept in a step shape without being rounded.

In the design of a very large scale integration circuit (VLSI), to increase the capacitance in the integrated circuit (IC), it has three effective methods. The first is that the thickness of the dielectric thin film mediated between two electrodes is reduced because the capacitance is inversely proportional to the distance between these two electrodes. This method can increase the capacitance effectively but is difficult to be controlled to obtain a uniform and stable dielectric thin film. The second method is that the interfacial area between the dielectric thin film and the electrode is increased because the capacitance is proportional to the size of this area. For the present, to increase the size of the interfacial area, such as one of a fin type and a hemispheric grain type is applied but has a difficulty for massive production due to the complexity of fabrication. Another option is taking a cylindrical type. The third method is that the dielectric constant is increased such as the materials of $Ta_2O_5$, Lead Zirconium Titanate (PZT) composed of $Pb(Zr, Ti)O_3$, and Bismuth Strontium Titanate (BST) composed of $(Ba,Sr)TiO_3$, which have high dielectric constant.

In the conventional method of fabricating a semiconductor device, a polysilicon material is usually to be taken for the electrodes of the capacitors. In this case, the higher the temperature is used in the process of annealing on the dielectric thin film, the lesser the defect exists in the dielectric thin film. This means the quality of the dielectric thin film should be better. But, if the temperatures used in the process of annealing is too high, a material of native oxide is easily produced around the interface between the dielectric thin film and the lower electrode to reduce the capacitance. Here, it doesn't happen around an interface between the dielectric thin film and an upper electrode because the upper interface has not been formed yet. On the contrary, if the temperatures used in the process of annealing is too low, and then the defect existing in the dielectric thin film would not effectively be removed.

Therefore, so far, to prevent the bad situations as described above, a metal layer, generally, is taken instead for the electrodes, which is usually made of a polysilicon layer in the conventional method. That is to say a Metal Insulator Metal (MIM) capacitor, which is especially applied in a Nonvolatile Ferroelectric Memory (FeRAM) and a DRAM with high integration.

The metal layer of the MIM capacitor is conventionally made of conductive material such as Platinum, Iridium, Iridium oxide or Ruthenium oxide. Unfortunately, using these materials for the MIM capacitor as the electrodes, it usually causes the bad quality of the profile of the electrode or the fence-like plate on the inner surface of the lower electrode. The fence-like plate being not easy to be removed is from the deposition of some remained reacting materials which are the products after the reaction of photoresist layer and the metal of the lower electrode during etching.

FIGS. 1–4 schematically illustrate the sectional plots of a capacitor in a DRAM in the conventional fabricating procedure. The like marks represent the like elements in the FIGS.

Referring to FIG. 1, a substrate 100 is provided, on which a number of field effect transistors in a DRAM are formed. One Field Effect Transistor (FET) includes a gate and an interchangeable source/drain region 106 on the active area. The neighboring FETs are isolated by a Field Oxide (FOX) 102 in between. Then, an insulating layer 108 is formed over the substrate 100 and is preferably including silicon dioxide by CVD. Then, the following is using the conventional technology of photolithography to define a contact window 109 on the insulating layer 108 and expose the interchangeable source/drain region 106 partly.

Then, an polysilicon layer 107 is deposited and fills the contact window 109 so that the polysilicon layer 107 is electrically coupled to the interchangeable source/drain region. After that, the process of etch back is utilized to remove the polysilicon layer 107 on the insulator layer 108.

Then a conductive layer 110 is over the polysilicon layer 107 to be a lower electrode of a capacitor for storing charges. Then, a photoresist layer 112 is defined on the conductive layer 110 to partly expose the conductive layer 110.

The conventional technology of etching to define the conductive layer 110 has two problems as follows:

1. Referring to FIG. 2, if an ion plasma beam with low ion energy, high pressure and low density is applied, then a slanted periphery wall 114 of the conductive layer 110a can be formed. For a DRAM with high integration, a micro-loading 111 is easy to happen between the neighboring capacitors under the etching by the conventional technology. The micro-loading 111 can cause the neighboring capacitors are connected to result in a short of the circuit. Each capacitor is corresponding to one block of conductive layer 110a. To avoid the micro-loading 111, the distance between the neighboring capacitors should be pulled farther but it undermines the high integration for fabricating the DRAM.

2. Referring to FIG. 3, if an ion plasma beam with high ion energy, low pressure and high density is applied, then even though the slanted periphery wall 114 under the etching as described above can be avoided, a fence-like plate 113 between a conductive layer 110b and a photoresist layer 112b can usually happen due to the by-products of the reactions between a metal oxide layer of the conductive layer 110b and the photoresist layer 112b. The fence-like plate 113 is not easy to be removed.

Referring to FIG. 4, after removing the photoresist layer 112b, the fence-like plate 113 is still adhering to the conductive layer 110b. If both the conductive layer 110b and the fence-like plate 113 are treated together directly as the lower electrode. The sharp area 115 on the fence-like plate 113 should cause the leakage current.

SUMMARY OF THE INVENTION

It is therefore an objective of the present invention to provide a fabricating procedure of a capacitor in a DRAM to make use of the fence-like plate to form a columnar capacitor. The fence-like plate is the by-product of the reactions between the metal oxide of the conductive layer and the photoresist layer under the operation of etching, which is using the ion plasma with high ion energy, low pressure and high density. Therefore, according to the invention, the fence-like plate no longer induces the leakage current from the sharp area of the fence-like plate, and, on the contrary, the fence-like plate gives some extra capacitor areas for storing more charges due to making use of the fence-like plate for the lower electrode.

It is another an objective of the present invention to provide a fabricating procedure of a capacitor in a DRAM, in which the technologies used in the procedure are compatible with the current conventional technologies. Therefore, the fabricating procedure in the invention is easy to be built up.

In accordance with the foregoing and other objectives of the present invention, a fabricating procedure of a capacitor in a DRAM is following:

A first conductive layer to be the lower electrode of the capacitor is formed over a substrate and is electrically coupled to an interchangeable source/drain area through a contact window penetrating an insulating layer, which has been formed over the substrate before the first conductive layer being formed. Then a defining is operated on the first conductive layer so as to form a fence-like plate with a higher height the a thickness of the first conductive layer, adhering to the first conductive layer. Next a second conductive layer is formed over the first conductive layer and the fence-like plate. Then the technology of etching back is utilized to round the sharp area of the fence-like plate. Then, a dielectric thin film is formed over the second conductive layer and a third conductive layer is formed over the dielectric thin film. Therefore, a MIM capacitor according to the preferred embodiment of the invention is formed.

BRIEF DESCRIPTION OF DRAWINGS

The invention can be more fully understood by reading the following detailed description of the preferred embodiment, with reference made to the accompanying drawings, wherein.

DETAILED DESCRIPTION OF PREFERRED EMBODIMENTS

FIGS. 5A–5F schematically illustrate the sectional plots of a capacitor in a DRAM according to the preferred embodiment of the invention. The like marks represents the like elements.

Figure 1:
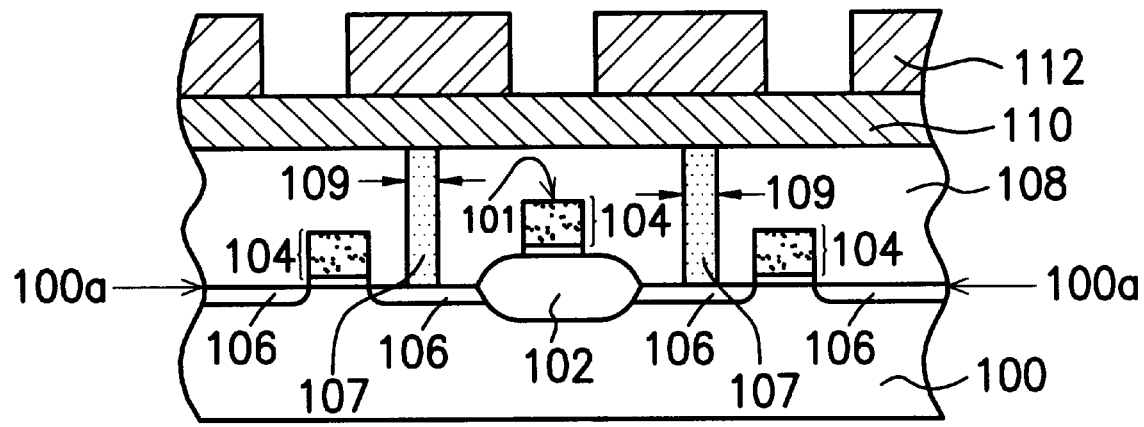
FIGS. 1–4 schematically illustrate the sectional plots of a capacitor in a DRAM in the conventional fabricating procedure.
Figure 2:
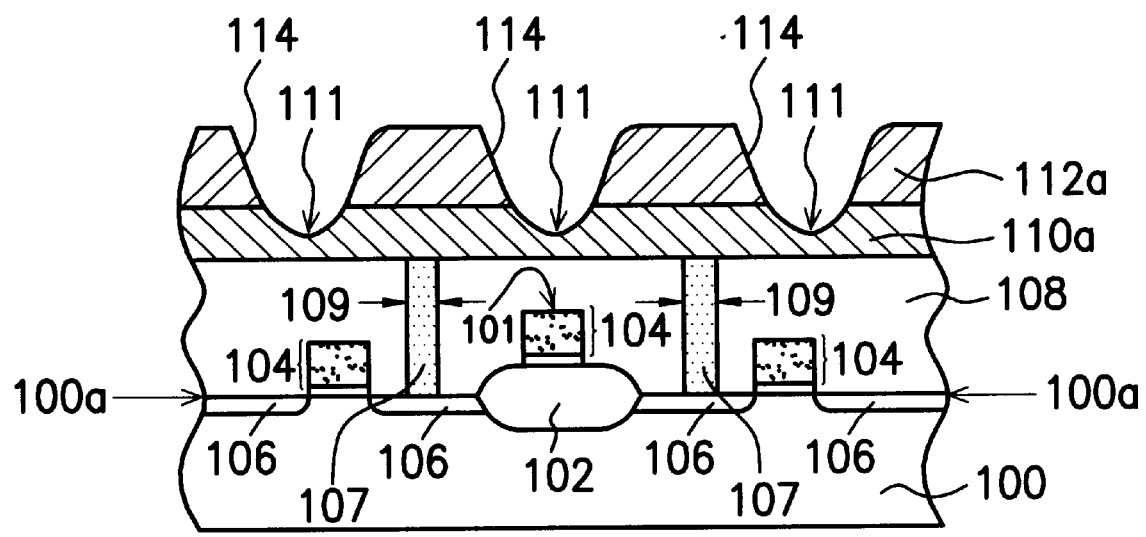
Figure 3:
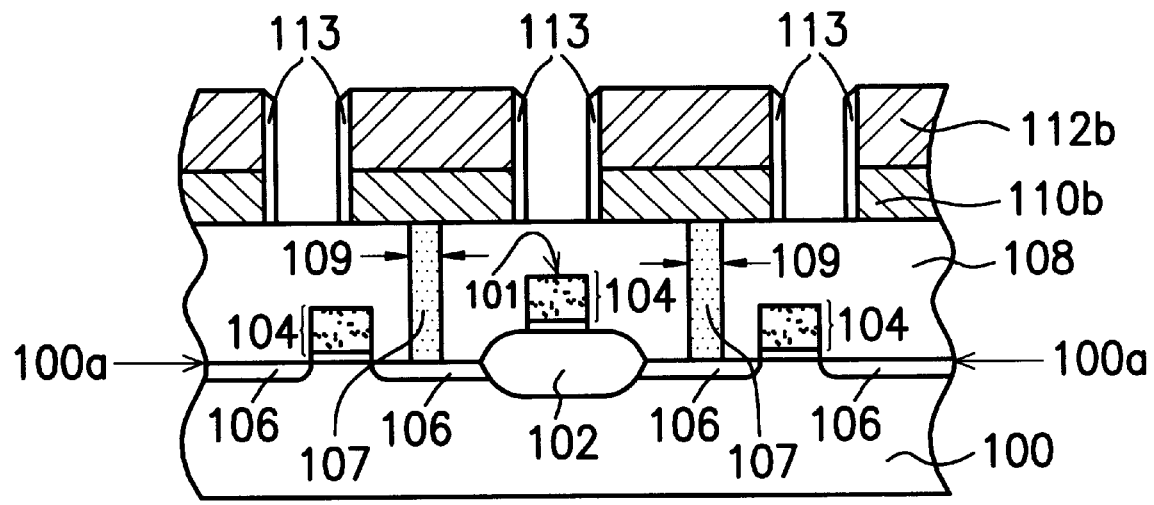
Figure 4:
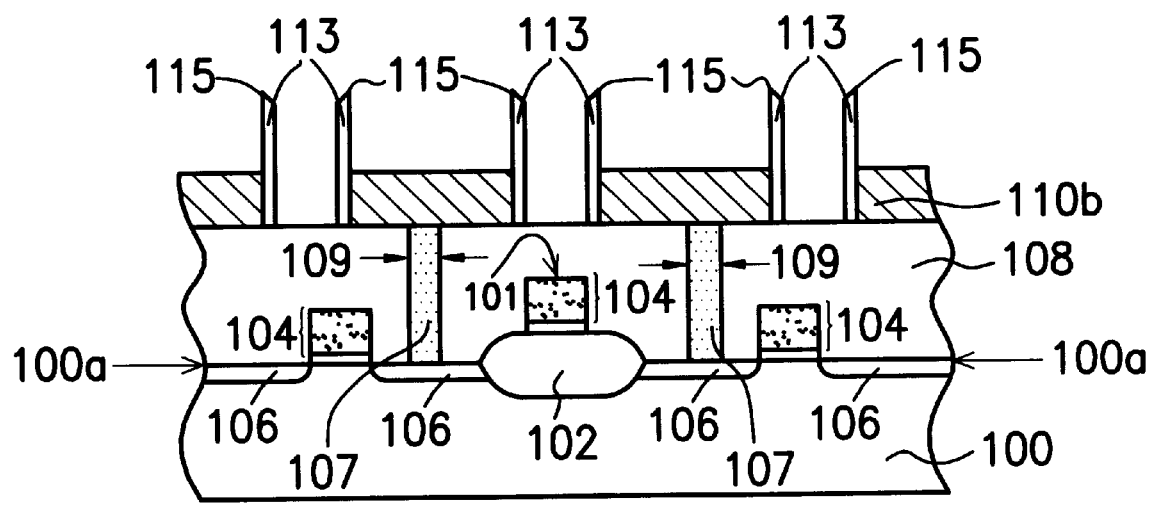
Figure 5A:
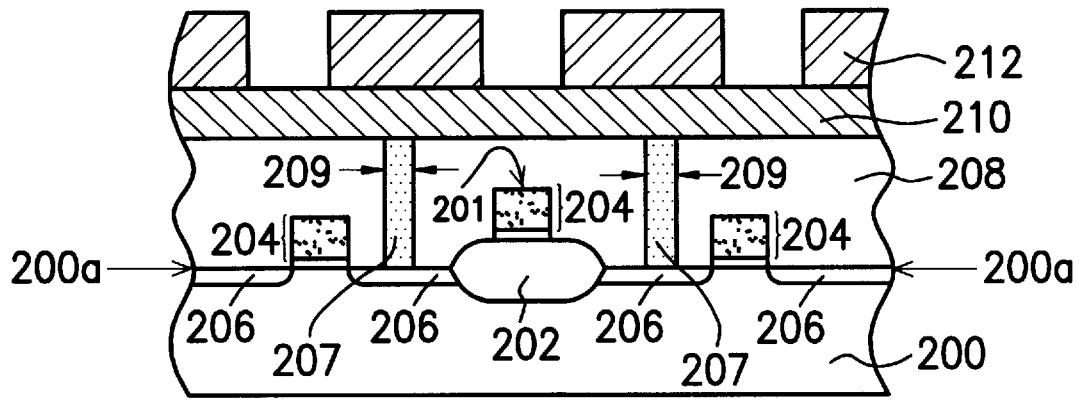
FIGS. 5A–5F schematically illustrate the sectional plots of a capacitor in a DRAM according to the preferred embodiment of the invention.

Referring to FIG. 5A, a FET 201 is formed over a semiconductor substrate 200 such as a silicon p-type substrate (not fully shown in FIG. 5A). Each FET 201 over the substrate 200 includes a gate 204, and an interchangeable source/drain region 206 under the substrate surface 200a. The neighboring FET 201 is isolated by a FOX 202. Because the gates 204 belonging to the same word line are connected together on the substrate 200, there is a gate 204 located on the FOX 202 in the sectional plot. The an insulating layer 208 is formed over the substrate 200 with a number of contact windows 209 being defined to partly expose the interchangeable source/drain region 206. The insulating layer can be formed by APCVD to include Boron-Phospho-Silicate-Glass (BPSG) or Tera-Ethly-Ortho-Silicate (TEOS) silicon dioxide. Next, the contact windows 209 is filled in with a polysilicon layer 207 by CVD to be electrically coupled with the interchangeable source/drain region. Next, using the process of etching back to remove the portion of polysilicon layer 207 extruding the insulating layer 208. Next, a conductive layer 210 is deposited over the polysilicon layer 207 and the insulating layer 208. The conductive layer 210 can be formed by CVD or sputtering including conductive materials such as Platinum, Iridium, Iridium oxide or Ruthenium oxide as the lower electrode. Then, a photoresist layer 212 is formed over the conductive layer 210 to partly expose the conductive layer 210.

Figure 5B:
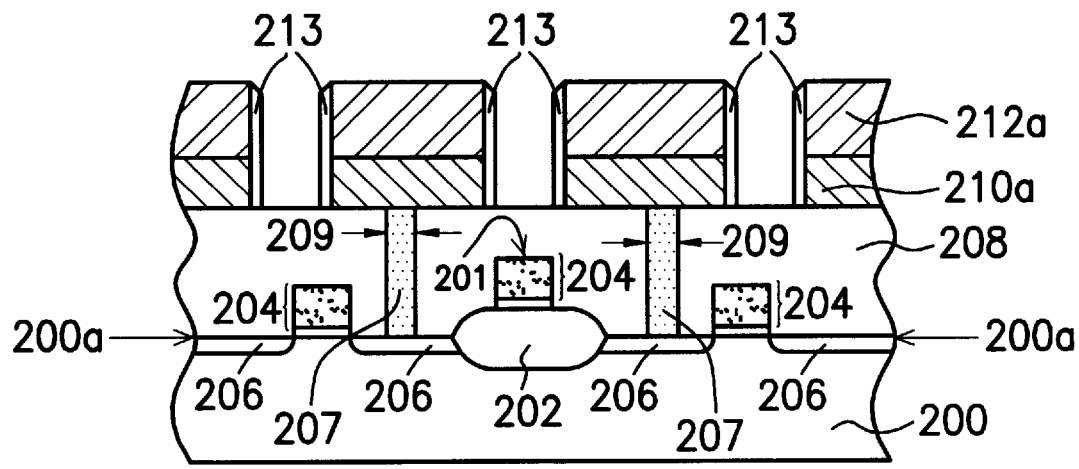

Referring to FIGS. 5A and 5B, by using the typical technology of etching to define the conductive layer 210a to partly expose the insulating layer 208. The preferred ion plasma for the etching is high ion energy, low pressure and high density of ion. Under this etching conditions, a fence-like plate 213 is formed on the periphery of the conductive layer 210a and the leftover of the photoresist layer 212a. The fence-like plate is the by-product of the reactions between the conductive layer 210a and the photoresist layer 212 under the operation of etching. The fence-like plate 213 is usually be a problem because of its not being easy to be removed. According to the invention, the conventional problem is no longer a problem and on the contrary it becomes the advantages in the invention. A capacitor of the invention has a MIM columnar structure in sectional plot being done in-situ, in which the periphery of the fence-like plate 213 has been utilized as the extra area for storing charges and the fabricating procedure can be simplified.

Figure 5C:
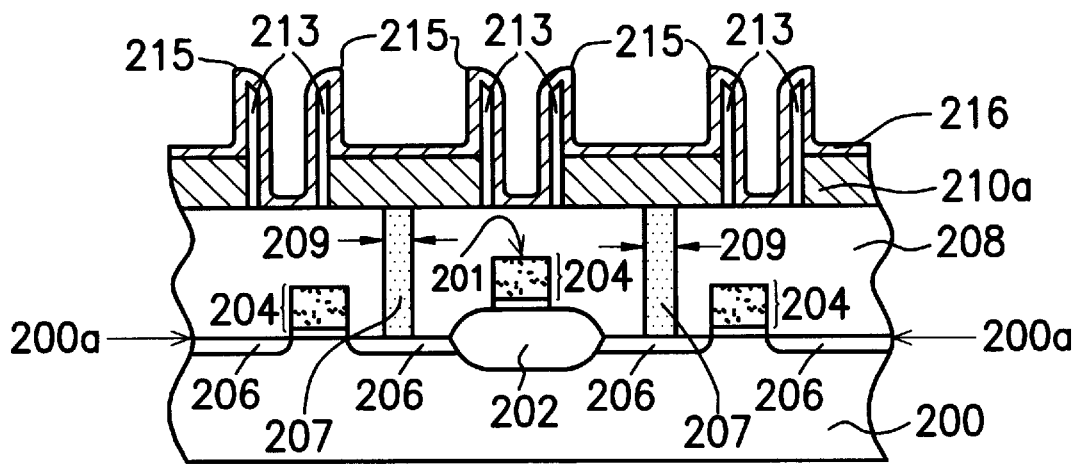

Referring to FIGS. 5B and 5C, after the photoresist layer 212a being removed, a conformal conductive layer 216 formed conformably over the conductive layer 210a, the fence-like plate 213 and the exposed area of the insulating layer 208. The method to fulfill this formation is using CVD or sputtering to deposit the material of Platinum, Iridium, Iridium oxide, Ruthenium oxide or other conductive materials with similar properties. On the tip of the fence-like plate 213, there is a sharp area 215.

Figure 5D:
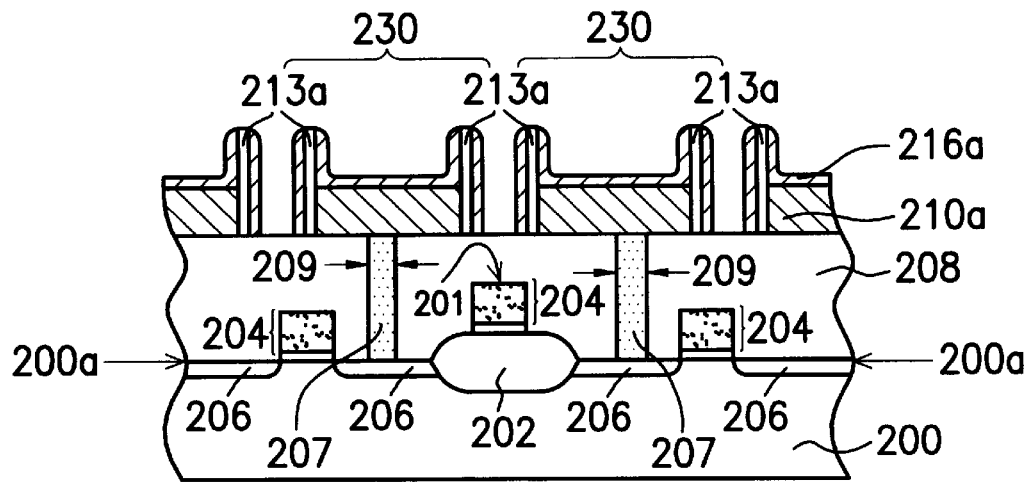

Referring to FIG. 5C and FIG. 5D, a process of etching back is applied to round the sharp area 215 so that the fence-like plate become the fence-like plate 213a. At the same time, a capacitor area 230 corresponding to each block of the conductive layer 210a is disconnected due to some portion of the conductive layer 216a having been removed. The portion of the conductive layer 216a on the sharp area 215 is removed either. So far, the fence-like plate 213a is sandwiched by the conductive layers 210a, 216a. The conductive layers 210a, 216a and the fence-like plate 213a are to be treated as the lower electrode of the capacitor to store the charges. This procedure to round the sharp area can avoid the leakage current after a dielectric thin film (to be shown in the following FIGS.) is formed over it.

Figure 5E:
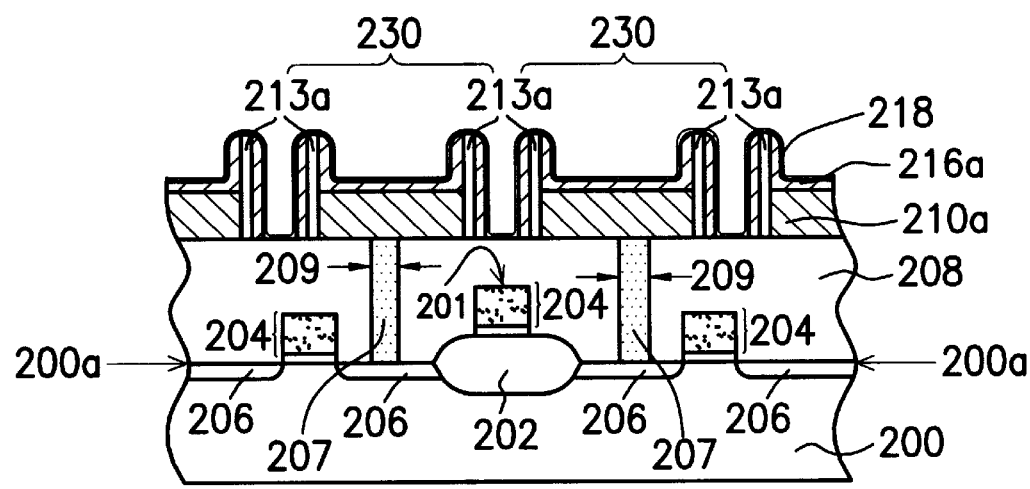

Referring to FIGS. 5D and 5E, a dielectric film 218 is formed over all the exposed area on the substrate 200 with a thickness about between 10 and 60 Angstrom. The dielectric film 218 can include a material with high dielectric constant such as oxide/nitride/oxide (ONO), $Ta_2O_5$, PZT or BST.

Figure 5F:
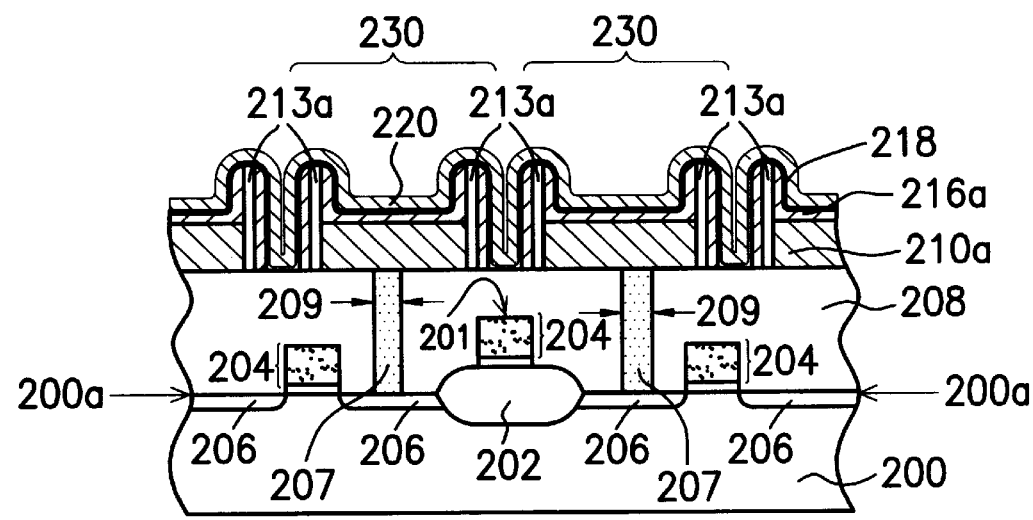

Referring to FIGS. 5D and 5F, over the dielectric thin film 218, a conductive layer 220 is formed to be treat as an upper electrode of the capacitor so that the capacitor can be formed. The method to fulfill this formation of the conductive layer 220 is using CVD or sputtering to deposit the material of Platinum, Iridium, Iridium oxide, Ruthenium oxide or other conductive materials with similar properties.

In conclusion, one of the characteristics of the present invention for a fabricating procedure of a capacitor in a DRAM is making use of the fence-like plate to form a columnar capacitor. The fence-like plate is the by-product of the reactions between the metal oxide of the conductive layer and the photoresist layer under the operation of etching, which is using the ion plasma with high ion energy, low pressure and high density. Therefore, according to the invention, the fence-like plate no longer causes the leakage current from the sharp area of the fence-like plate, and, on the contrary, the fence-like plate gives some extra capacitor areas for storing more charges due to making use of the fence-like plate for the lower electrode.

The invention has another characteristics to provide a fabricating procedure of a capacitor in a DRAM, in which the technologies used in the procedure are compatible with the current conventional technologies. Therefore, the fabricating procedure in the invention is easy to be built up.

The invention has been described using exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor of a dynamic random access memory (DRAM), the method comprising providing a substrate, wherein a field effect transistor comprising a gate and two interchangeable source/drain regions is formed on the substrate, forming an insulating layer over the substrate;

patterning the insulating layer to form a contact window which exposes one of the interchangeable source/drain regions;

forming a first conductive layer over the insulating layer with the contact window being filled so that the first conductive layer is electrically coupled to said one of the interchangeable source/drain regions through the contact window;

forming a patterned photoresist layer over the first conductive layer;

performing an etching process using a plasma ion source with high ion energy, low pressure and high density and the patterned photoresist layer as a mask to define the first conductive layer so that an opening through the first conductive layer and the patterned photoresist layer is formed to expose the insulating layer and a fence-like plate is formed around a periphery of the opening;

after removing the patterned photoresist layer, forming a second conductive layer to cover the fence-like plate and the first conductive layer, wherein the second conductive layer and the fence-like plate together form a sharp upper end;

performing an etching back process so that the sharp upper end is rounded and a plurality of capacitor areas are formed;

forming a dielectric thin film over the substrate; and forming a third conductive layer over the dielectric thin film to act as an upper electrode.

2. The fabricating procedure of claim 1, wherein the first conductive layer is formed by Chemical Vapor Deposition (CVD).

3. The fabricating procedure of claim 1, wherein the first conductive layer comprises polysilicon.

4. The fabricating procedure of claim 1, wherein the first conductive layer comprises Platinum.

5. The fabricating procedure of claim 1, wherein the first conductive layer comprises Iridium.

6. The fabricating procedure of claim 1, wherein the first conductive layer comprises Iridium oxide.

7. The fabricating procedure of claim 1, wherein the first conductive layer comprises Ruthenium oxide.

8. The fabricating procedure of claim 1, wherein in said step of performing the etching process to define the first conductive layer, the fence-like plate is formed spontaneously on the periphery of the opening.

9. The fabricating procedure of claim 1, wherein the second conductive layer comprises Platinum.

10. The fabricating procedure of claim 1, wherein the second conductive layer comprises Iridium.

11. The fabricating procedure of claim 1, wherein the second conductive layer comprises Iridium oxide.

12. The fabricating procedure of claim 1, wherein the second conductive layer comprises Ruthenium oxide.

13. The fabricating procedure of claim 1, wherein the second conductive layer is formed by CVD.

14. The fabricating procedure of claim 1, wherein the first conductive layer, the second conductive layer and the fence-like plate form a lower electrode.

15. The fabricating procedure of claim 1, wherein the dielectric thin film comprises oxide/nitride/oxide.

16. The fabricating procedure of claim 1, wherein the dielectric thin film comprises $Ta_2O_5$.

17. The fabricating procedure of claim 1, wherein the dielectric thin film comprises $Pb(Zr,Ti)O_3$ (PZT).

18. The fabricating procedure of claim 1, wherein the dielectric thin film comprises $(Ba,Sr)TiO_3$ (BST).

19. The fabricating procedure of claim 1, wherein the third conductive layer comprises Platinum.

20. The fabricating procedure of claim 1, wherein the third conductive layer comprises Iridium.

21. The fabricating procedure of claim 1, wherein the third conductive layer comprises Iridium oxide.

22. The fabricating procedure of claim 1, wherein the second conductive layer comprises Ruthenium oxide.

23. The fabricating procedure of claim 1, wherein the third conductive layer is formed by CVD.

24. The fabricating procedure of claim 1, wherein the third conductive layer is treated as an upper electrode of the capacitor.

* * * * *